United States Patent
Lo et al.

(10) Patent No.: US 8,552,553 B2
(45) Date of Patent: Oct. 8, 2013

(54) SEMICONDUCTOR DEVICE

(75) Inventors: Jian-Wen Lo, Kaohsiung (TW);
Chien-Fan Chen, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 434 days.

(21) Appl. No.: 12/790,090

(22) Filed: May 28, 2010

(65) Prior Publication Data

US 2011/0084389 A1    Apr. 14, 2011

(30) Foreign Application Priority Data

Oct. 14, 2009 (TW) .............................. 98134807 A (51) Int. Cl.
*H01L 23/48* (2006.01)
*H01L 23/52* (2006.01)
*H01L 29/40* (2006.01)

(52) U.S. Cl.
USPC ................... 257/737; 257/E21.503; 257/778; 438/108

(58) Field of Classification Search
USPC ............................ 438/108; 257/778, E21.503
See application file for complete search history.

(56) References Cited

U.S. PATENT DOCUMENTS

| | | | |
|---|---|---|---|
| 3,761,309 A | 9/1973 | Schmitter et al. |
| 4,341,594 A | 7/1982 | Carlson et al. |
| 4,845,542 A | 7/1989 | Bezuk et al. |
| 5,466,635 A | 11/1995 | Lynch et al. |
| 5,629,564 A | 5/1997 | Nye, III et al. |
| 5,640,052 A | 6/1997 | Tsukamoto |
| 5,656,858 A | 8/1997 | Kondo et al. |
| 5,698,465 A | 12/1997 | Lynch et al. |
| 5,790,377 A | 8/1998 | Schreiber et al. |

(Continued)

FOREIGN PATENT DOCUMENTS

| | | |
|---|---|---|
| CN | 1391278 | 1/2003 |
| CN | 1835218 | 9/2006 |

(Continued)

OTHER PUBLICATIONS

Lo et al., U.S. Appl. No. 12/856,403, filed Aug. 13, 2010 for "Chip Having a Metal Pillar Structure."

*Primary Examiner* — Ha Tran T Nguyen
*Assistant Examiner* — Aaron Dehne
(74) *Attorney, Agent, or Firm* — Foley & Lardner LLP (57) ABSTRACT

The present invention relates to a semiconductor device. The semiconductor device includes a substrate and a chip. The chip is electrically connected to the substrate. The chip includes a chip body, at least one chip pad, a first passivation, an under ball metal layer and at least one metal pillar structure. The chip pad is disposed adjacent to an active surface of the chip body. The first passivation is disposed adjacent to the active surface, and exposes part of the chip pad. The under ball metal layer is disposed adjacent to the chip pad. The metal pillar structure contacts the under ball metal layer to form a first contact surface having a first diameter. The metal pillar structure is electrically connected to a substrate pad of the substrate to form a second contact surface having a second diameter. The ratio of the first diameter to the second diameter is between 0.7 and 1.0. As a result, the first contact surface and the second contact surface have an equivalent bonding force, which prevents the metal pillar structure from cracking due to a shear stress. Thus, the structure strength of the semiconductor device is enhanced and the semiconductor device can pass the reliability test.

20 Claims, 7 Drawing Sheets

(56) References Cited

U.S. PATENT DOCUMENTS

| | | | |
|---|---|---|---|
| 5,872,404 A | 2/1999 | Lynch et al. | |
| 5,914,536 A | 6/1999 | Shizuki et al. | |
| 5,943,597 A | 8/1999 | Kleffner et al. | |
| 6,013,571 A | 1/2000 | Morrell | |
| 6,028,357 A | 2/2000 | Moriyama | |
| 6,051,450 A | 4/2000 | Oshawa et al. | |
| 6,077,765 A | 6/2000 | Naya | |
| 6,107,164 A | 8/2000 | Ohuchi | |
| 6,159,837 A | 12/2000 | Yamaji et al. | |
| 6,229,220 B1 | 5/2001 | Saitoh et al. | |
| 6,281,106 B1 | 8/2001 | Higdon et al. | |
| 6,350,705 B1 | 2/2002 | Lin | |
| 6,362,087 B1 | 3/2002 | Wang et al. | |
| 6,362,090 B1 | 3/2002 | Paik et al. | |
| 6,378,759 B1 | 4/2002 | Ho et al. | |
| 6,501,185 B1 | 12/2002 | Chow et al. | |
| 6,510,976 B2 | 1/2003 | Hwee et al. | |
| 6,550,666 B2 | 4/2003 | Chew et al. | |
| 6,573,598 B2 | 6/2003 | Ohuchi et al. | |
| 6,578,754 B1 | 6/2003 | Tung | |
| 6,592,019 B2 | 7/2003 | Tung | |
| 6,599,775 B2 | 7/2003 | Tie et al. | |
| 6,600,234 B2 | 7/2003 | Kuwabara et al. | |
| 6,639,299 B2 | 10/2003 | Aoki | |
| 6,642,136 B1 | 11/2003 | Lee et al. | |
| 6,664,128 B2 | 12/2003 | Tong et al. | |
| 6,677,674 B2 | 1/2004 | Nagao | |
| 6,681,982 B2 | 1/2004 | Tung | |
| 6,683,375 B2 | 1/2004 | Joshi et al. | |
| 6,731,003 B2 | 5/2004 | Joshi et al. | |
| 6,732,913 B2 | 5/2004 | Alvarez | |
| 6,734,039 B2 | 5/2004 | Hwee et al. | |
| 6,740,577 B2 | 5/2004 | Jin et al. | |
| 6,750,082 B2 | 6/2004 | Briar et al. | |
| 6,756,671 B2 | 6/2004 | Lee et al. | |
| 6,784,087 B2 | 8/2004 | Lee et al. | |
| 6,818,545 B2 | 11/2004 | Lee et al. | |
| 6,888,209 B2 | 5/2005 | Jobetto | |
| 6,917,119 B2 | 7/2005 | Lee et al. | |
| 6,929,981 B2 | 8/2005 | Hwee et al. | |
| 6,940,168 B2 | 9/2005 | Garrity et al. | |
| 7,008,867 B2 | 3/2006 | Lei | |
| 7,022,548 B2 | 4/2006 | Joshi et al. | |
| 7,087,458 B2 | 8/2006 | Wang et al. | |
| 7,122,403 B2 | 10/2006 | Chandran et al. | |
| 7,135,770 B2 | 11/2006 | Nishiyama et al. | |
| 7,268,438 B2 | 9/2007 | Nishiyama et al. | |
| 7,276,801 B2 | 10/2007 | Dubin et al. | |
| 7,361,990 B2 | 4/2008 | Lu et al. | |
| 7,391,112 B2 | 6/2008 | Li et al. | |
| 7,449,406 B2 | 11/2008 | Nishiyama et al. | |
| 7,456,496 B2 | 11/2008 | Hwee et al. | |
| 7,476,564 B2 | 1/2009 | Chen et al. | |
| 7,550,375 B2 | 6/2009 | Wang et al. | |
| 7,750,469 B2 | 7/2010 | Cho et al. | |
| 2002/0011664 A1 | 1/2002 | Tanaka | |
| 2003/0127734 A1 | 7/2003 | Lee et al. | |
| 2003/0129822 A1* | 7/2003 | Lee et al. | 438/613 |
| 2003/0219966 A1 | 11/2003 | Jin et al. | |
| 2004/0087057 A1* | 5/2004 | Wang et al. | 438/106 |
| 2006/0006544 A1 | 1/2006 | Farrar | |
| 2007/0004086 A1* | 1/2007 | Hua et al. | 438/108 |
| 2007/0075423 A1* | 4/2007 | Ke et al. | 257/737 |
| 2007/0249093 A1* | 10/2007 | Aiba et al. | 438/108 |
| 2008/0150161 A1* | 6/2008 | Lin et al. | 257/778 |
| 2008/0296761 A1 | 12/2008 | Lee et al. | |
| 2009/0072385 A1 | 3/2009 | Alley et al. | |
| 2009/0096092 A1* | 4/2009 | Patel | 257/737 |
| 2009/0155955 A1 | 6/2009 | Liang | |
| 2009/0289360 A1 | 11/2009 | Takahashi et al. | |
| 2010/0055846 A1 | 3/2010 | Lii et al. | |
| 2010/0105173 A1 | 4/2010 | Fujimori | |
| 2010/0155946 A1* | 6/2010 | Lee | 257/738 |
| 2010/0244024 A1* | 9/2010 | Do et al. | 257/48 |
| 2011/0084381 A1 | 4/2011 | Lo et al. | |
| 2012/0074532 A1 | 3/2012 | Shih et al. | |

FOREIGN PATENT DOCUMENTS

| | | |
|---|---|---|
| CN | 1866504 | 11/2006 |
| JP | 54128669 | 10/1979 |
| JP | 60217646 | 10/1985 |
| JP | 62160744 | 7/1987 |
| JP | 1123440 | 5/1989 |
| JP | 4144143 | 5/1992 |
| JP | 5109820 | 4/1993 |
| JP | 5152376 | 6/1993 |
| JP | 5315399 | 11/1993 |
| JP | 7211722 | 8/1995 |
| JP | 7335648 | 12/1995 |
| JP | 8008259 | 1/1996 |
| JP | 8013166 | 1/1996 |
| JP | 9266230 | 10/1997 |
| JP | 9045691 | 12/1997 |
| JP | 2000091371 | 3/2000 |
| JP | 2000269387 | 9/2000 |
| JP | 2002043352 | 2/2002 |
| JP | 2006279062 | 10/2006 |
| JP | 2008047667 | 2/2008 |

\* cited by examiner

SEMICONDUCTOR DEVICE

BACKGROUND OF THE INVENTION

1. Field of the Invention

The present invention relates to a semiconductor device, and more particularly to a semiconductor device having a chip electrically connected to a substrate.

2. Description of the Related Art

Figure 1:
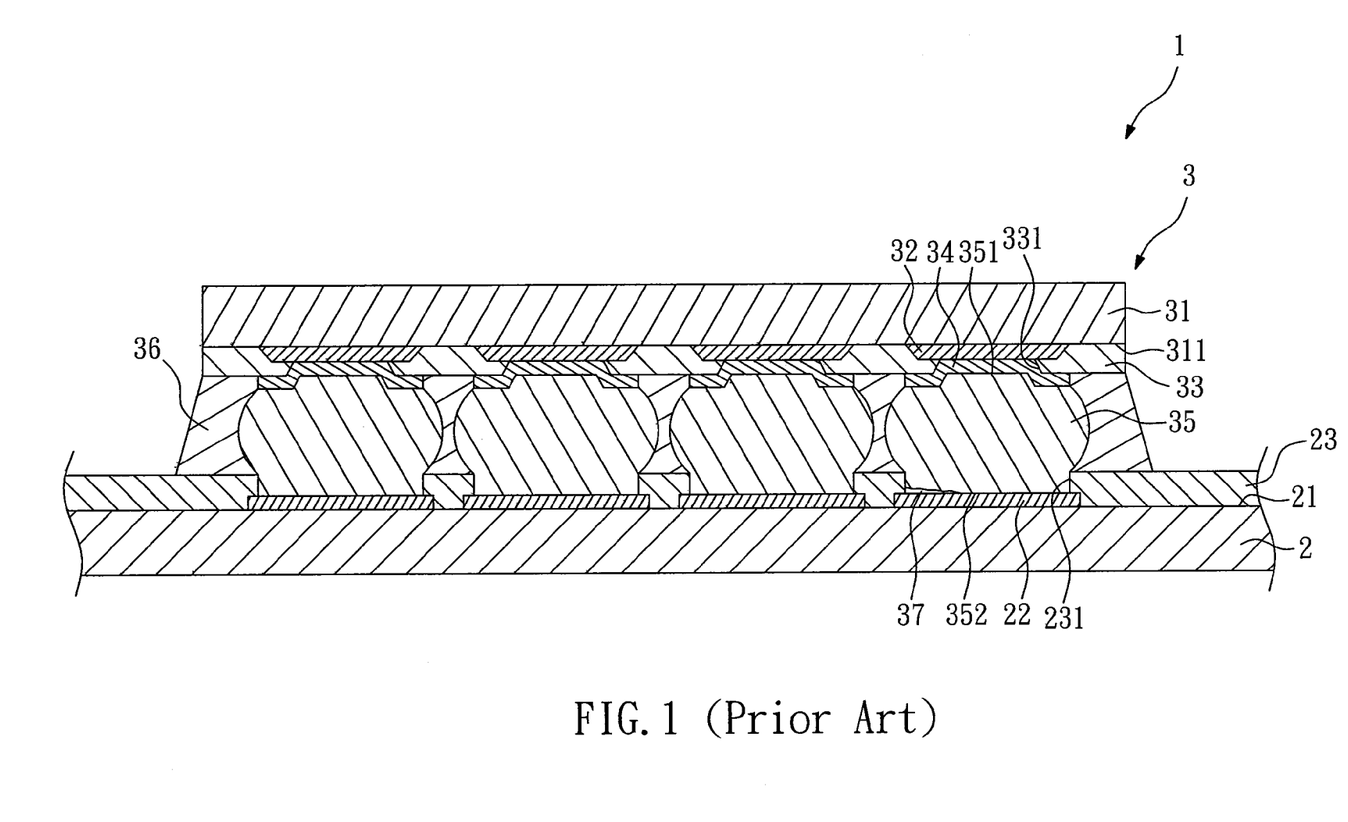
FIG. 1 is a cross-sectional view of a conventional semiconductor device.

FIG. 1 shows a cross-sectional view of a conventional semiconductor device. The conventional semiconductor device 1 comprises a substrate 2, a chip 3 and an underfill 36. The substrate 2 has a first surface 21, at least one substrate pad 22 and a solder mask 23. The substrate pad 22 is disposed adjacent to the first surface 21. The solder mask 23 is disposed adjacent to the first surface 21, and has at least one solder mask opening 231 so as to expose part of the substrate pad 22. The chip 3 is disposed adjacent to the first surface 21 of the substrate 2, and is electrically connected to the substrate 2. The chip 3 comprises a chip body 31, at least one chip pad 32, a first passivation 33, an under ball metal layer 34 and at least one bump 35. The chip body 31 has an active surface 311. The chip pad 32 is disposed adjacent to the active surface 311. The first passivation 33 is disposed adjacent to the active surface 311, and has at least one first opening 331 so as to expose part of the chip pad 32. The under ball metal layer 34 is disposed adjacent to the chip pad 32. The bump 35 is disposed adjacent to the under ball metal layer 34, and contacts the substrate pad 22 of the substrate 2. The bump 35 contacts the under ball metal layer 34 to form a first contact surface 351. The bump 35 contacts the substrate pad 22 of the substrate 2 to form a second contact surface 352. The underfill 36 encapsulates part of the active surface 311 of the chip 3 and the bump 35 of the chip 3.

The conventional semiconductor device 1 has the following disadvantages. A reliability test is conducted to make sure that the yield rate of the conventional semiconductor device 1 achieve a predetermined standard after it undergoes a great change in temperature. However, the coefficients of thermal expansion of every component of the conventional semiconductor device 1 are different, so the bump 35 endures a shear stress due to the expansion or contraction of its surrounding components. Moreover, if the first contact surface 351 or the second contact surface 352 has a relative weak bonding force, a crack 37 will easily occur between the bump 35 and the contact surface which has a relative weak bonding force.

Therefore, it is necessary to provide a semiconductor device to solve the above problems.

SUMMARY OF THE INVENTION

The present invention is directed to a semiconductor device. The semiconductor device comprises a substrate and a chip. The substrate has a first surface and at least one substrate pad. The substrate pad is disposed adjacent to the first surface. The chip is disposed adjacent to the first surface of the substrate, and is electrically connected to the substrate. The chip comprises a chip body, at least one chip pad, a first passivation, an under ball metal layer and at least one metal pillar structure. The chip body has an active surface. The chip pad is disposed adjacent to the active surface. The first passivation is disposed adjacent to the active surface, and has at least one first opening so as to expose part of the chip pad. The under ball metal layer is disposed adjacent to the chip pad. The metal pillar structure is disposed adjacent to the under ball metal layer, and electrically connected to the substrate pad of the substrate. The metal pillar structure contacts the under ball metal layer to form a first contact surface having a first diameter. The metal pillar structure is electrically connected to the substrate pad of the substrate to form a second contact surface having a second diameter. The ratio of the first diameter to the second diameter is between 0.7 and 1.0.

As a result, the first contact surface and the second contact surface have an equivalent bonding force, which prevents the metal pillar structure from cracking due to a shear stress. Thus, the structure strength of the semiconductor device is enhanced and the semiconductor device can pass the reliability test.

DETAILED DESCRIPTION OF THE INVENTION

Figure 2:
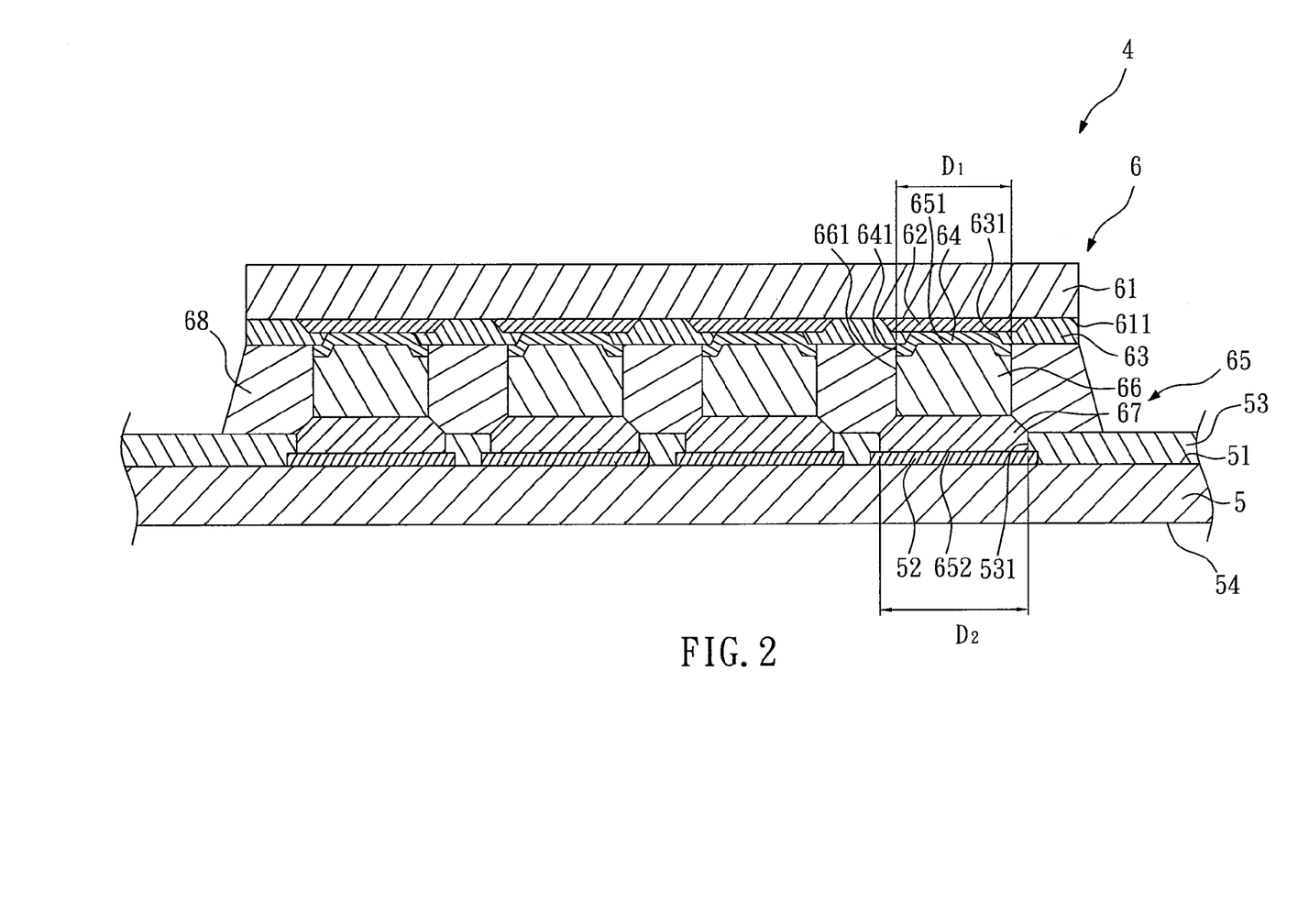
FIG. 2 is a cross-sectional view of a semiconductor device according to a first embodiment of the present invention.

FIG. 2 shows a cross-sectional view of a semiconductor device according to a first embodiment of the present invention. The semiconductor device 4 comprises a substrate 5, a chip 6 and an underfill 68. The substrate 5 has a first surface 51 and at least one substrate pad 52, and the substrate pad 52 is disposed adjacent to the first surface 51. In the embodiment, the substrate 5 further comprises a solder mask 53. The solder mask 53 is disposed adjacent to the first surface 51, and has at least one solder mask opening 531 so as to expose part of the substrate pad 52. In other applications, the substrate 5 further comprises a second surface 54 and at least one solder ball (not shown), and the solder ball is disposed adjacent to the second surface 54.

The chip 6 is disposed adjacent to the first surface 51 of the substrate 5, and is electrically connected to the substrate 5. The chip 6 comprises a chip body 61, at least one chip pad 62, a first passivation 63, an under ball metal layer 64 and at least one metal pillar structure 65. The chip body 61 has an active surface 611. The chip pad 62 is disposed adjacent to the active surface 611. The first passivation 63 is disposed adjacent to the active surface 611, and has at least one first opening 631 so as to expose part of the chip pad 62. The under ball metal layer 64 is disposed adjacent to the chip pad 62. In the embodiment, the under ball metal layer 64 is a multi-layered structure including titanium (Ti), aluminum (Al), nickel (Ni), vanadium (V) or copper (Cu).

The metal pillar structure 65 is disposed adjacent to the under ball metal layer 64, and electrically connected to the substrate pad 52 of the substrate 5. The metal pillar structure 65 contacts the under ball metal layer 64 to form a first contact surface 651 having a first diameter $D_1$. In the embodiment, the first diameter $D_1$ substantially equals the diameter of the under ball metal layer 64. The metal pillar structure 65 is electrically connected to the substrate pad 52 of the substrate 5 to form a second contact surface 652 having a second diameter $D_2$. In the embodiment, the second diameter $D_2$ substantially equals the diameter of the solder mask opening 531. The ratio of the first diameter $D_1$ to the second diameter $D_2$ ($D_1/D_2$) is between 0.7 and 1.0. In other words, the ratio of the area of the first contact surface 651 to the area of the second contact surface 652 is between 0.49 and 1.0.

Figure 3:
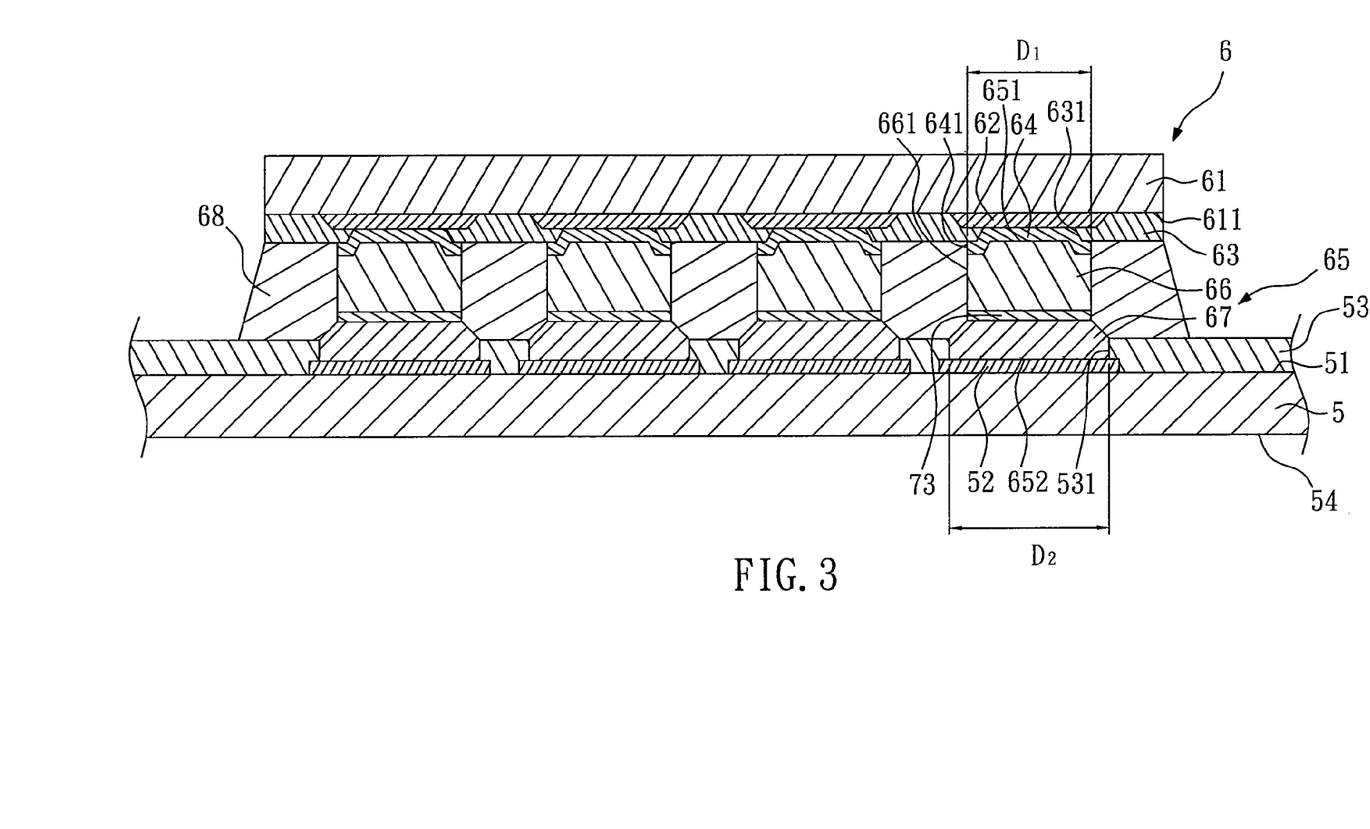
FIG. 3 is a cross-sectional view of a semiconductor device according to the first embodiment of the present invention, wherein the semiconductor device further comprises a barrier layer.

In the embodiment, the metal pillar structure 65 comprises a metal pillar 66 and a solder 67. The metal pillar 66 contacts the under ball metal layer 64 to form the first contact surface 651. The external surface 661 of the metal pillar 66 is substantially aligned with the external surface 641 of the under ball metal layer 64, and the material of the metal pillar 66 is copper (Cu). The solder 67 is disposed adjacent to the metal pillar 66, and contacts the substrate pad 52 of the substrate 5 to form the second contact surface 652. In other applications, the metal pillar structure 65 further comprises a barrier layer 73, as shown in FIG. 3. The barrier layer 73 is disposed between the metal pillar 66 and the solder 67, and the material of the barrier layer 73 is nickel (Ni). In the embodiment, the underfill 68 encapsulates part of the active surface 611 of the chip 6 and the metal pillar structure 65 of the chip 6.

As a result, the first contact surface 651 and the second contact surface 652 have an equivalent bonding force, which prevents the metal pillar structure 65 from cracking due to a shear stress. Thus, the structure strength of the semiconductor device 4 is enhanced and the semiconductor device 4 can pass the reliability test.

Figure 4:
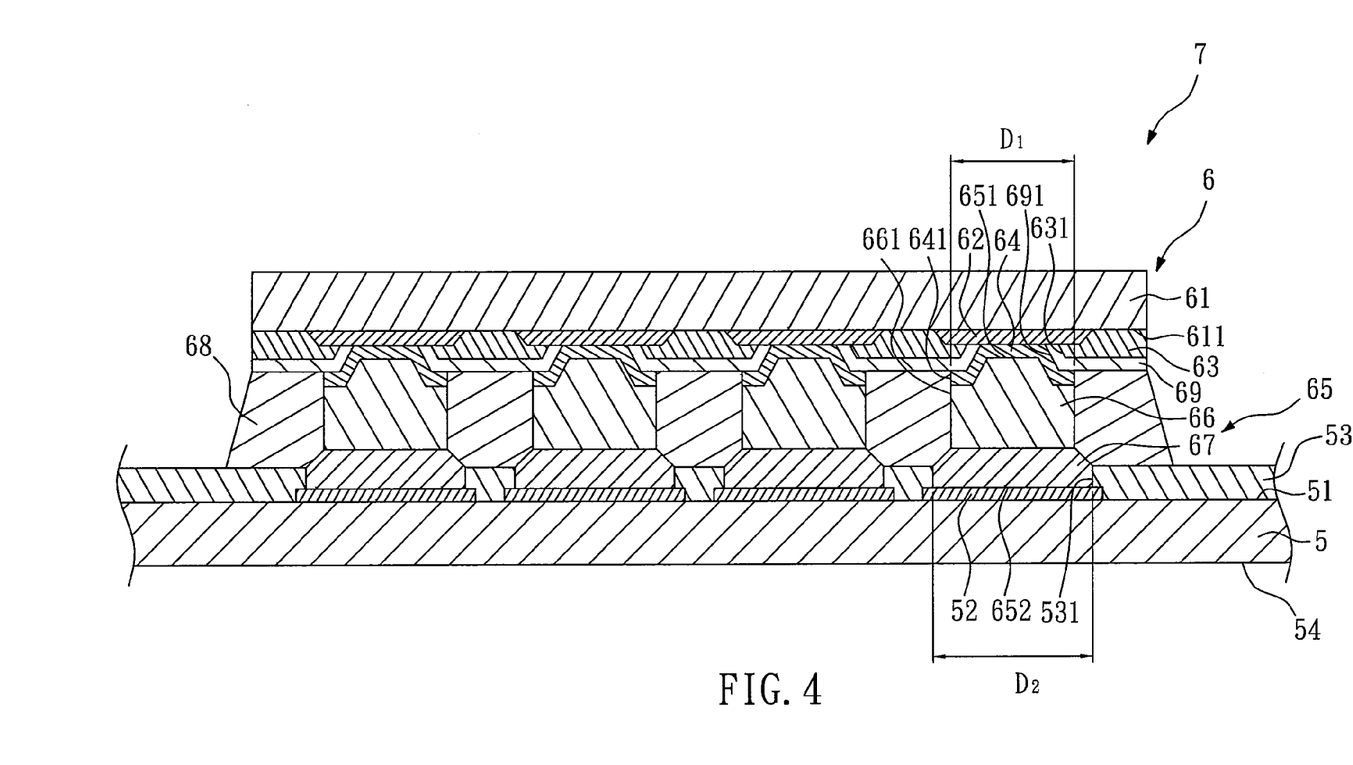
FIG. 4 is a cross-sectional view of a semiconductor device according to a second embodiment of the present invention.

FIG. 4 shows a cross-sectional view of a semiconductor device according to a second embodiment of the present invention. The semiconductor device 7 according to the second embodiment is substantially the same as the semiconductor device 4 (FIG. 2) according to the first embodiment, and the same elements are designated by the same reference numbers. The difference between the semiconductor device 7 and the semiconductor device 4 (FIG. 2) is that the semiconductor device 7 further comprises a second passivation 69 disposed adjacent to the first passivation 63 and having at least one second opening 691 so as to expose part of the chip pad 62. In the embodiment, the material of the second passivation 69 is polyimide (PI), and the second opening 691 of the second passivation 69 is smaller than the first opening 631 of the first passivation 63. The under ball metal layer 64 is disposed adjacent to the chip pad 62, and covers part of the second passivation 69.

Figure 5:
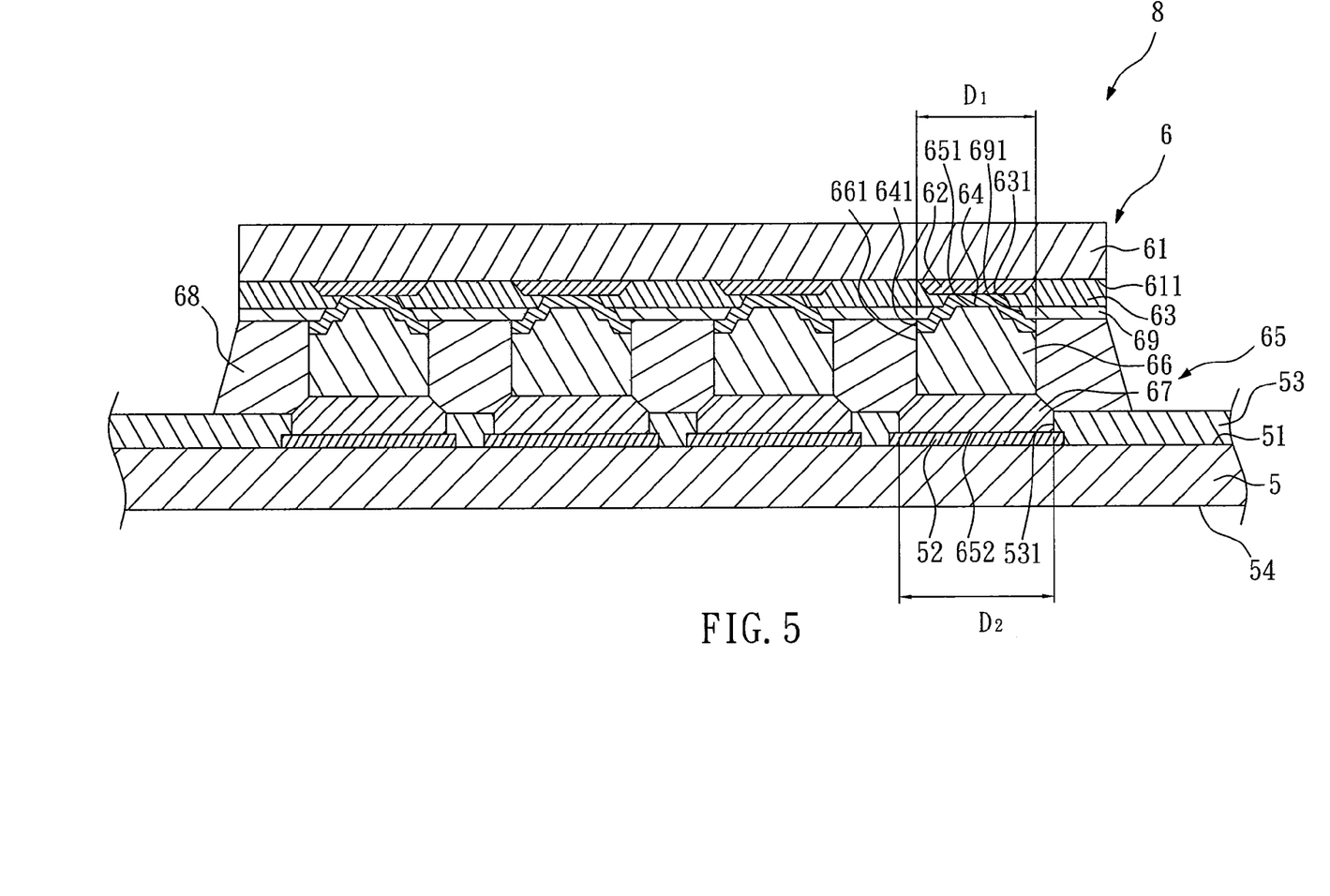
FIG. 5 is a cross-sectional view of a semiconductor device according to a third embodiment of the present invention.

FIG. 5 shows a cross-sectional view of a semiconductor device according to a third embodiment of the present invention. The semiconductor device 8 according to the third embodiment is substantially the same as the semiconductor device 7 (FIG. 4) according to the second embodiment, and the same elements are designated by the same reference numbers. The difference between the semiconductor device 8 and the semiconductor device 7 (FIG. 4) is that the second opening 691 of the second passivation 69 is larger than the first opening 631 of the first passivation 63, so as to expose part of the chip pad 62 and part of the first passivation 63. The under ball metal layer 64 is disposed adjacent to the chip pad 62, and covers part of the first passivation 63 and part of the second passivation 69.

Figure 6:
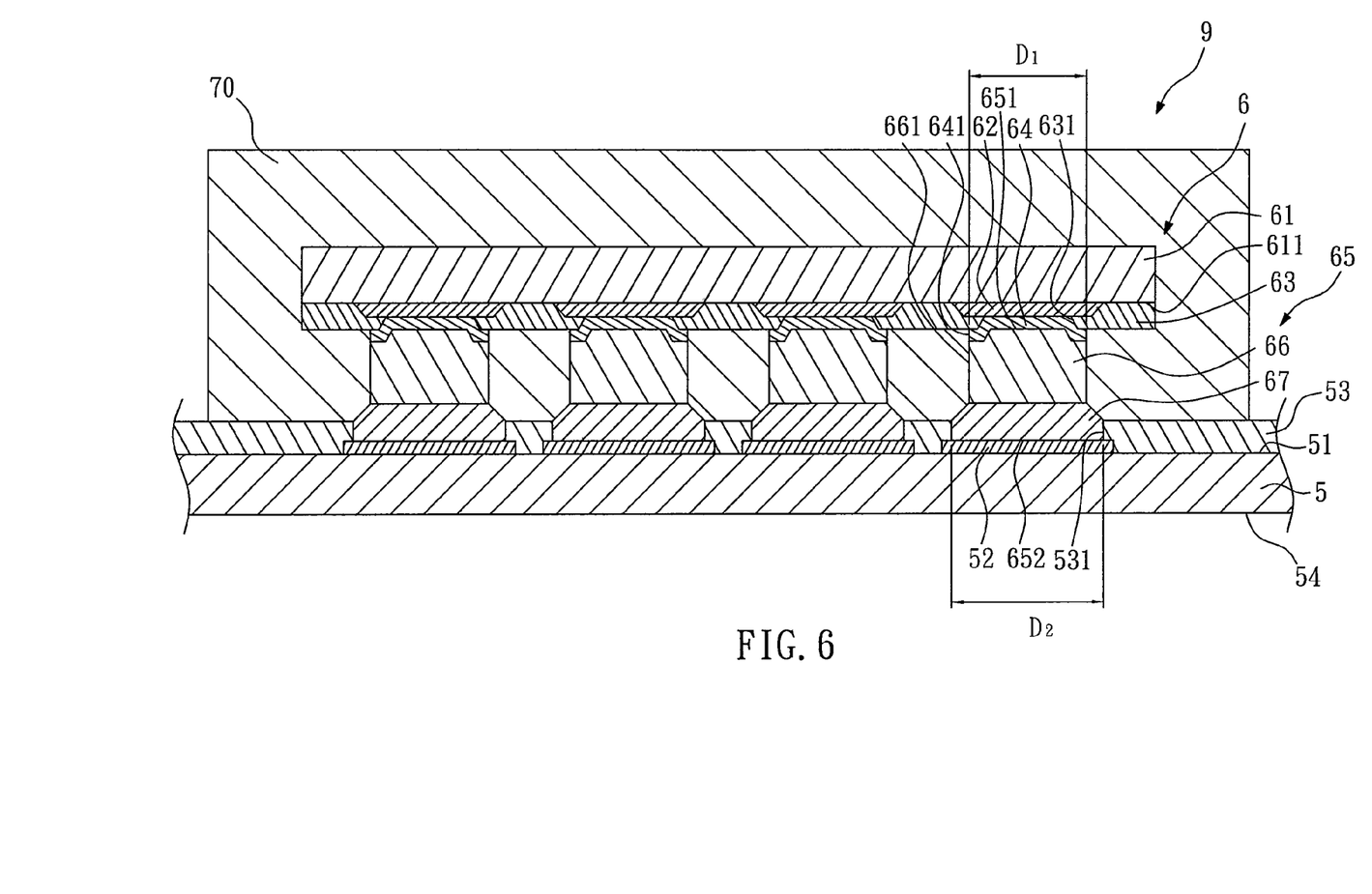
FIG. 6 is a cross-sectional view of a semiconductor device according to a fourth embodiment of the present invention.

FIG. 6 shows a cross-sectional view of a semiconductor device according to a fourth embodiment of the present invention. The semiconductor device 9 according to the fourth embodiment is substantially the same as the semiconductor device 4 (FIG. 2) according to the first embodiment, and the same elements are designated by the same reference numbers. The difference between the semiconductor device 9 and the semiconductor device 4 (FIG. 2) is that the semiconductor device 9 further comprises a molding compound 70 rather than the underfill 68. The molding compound 70 encapsulates part of the substrate 5 and the chip 6.

Figure 7:
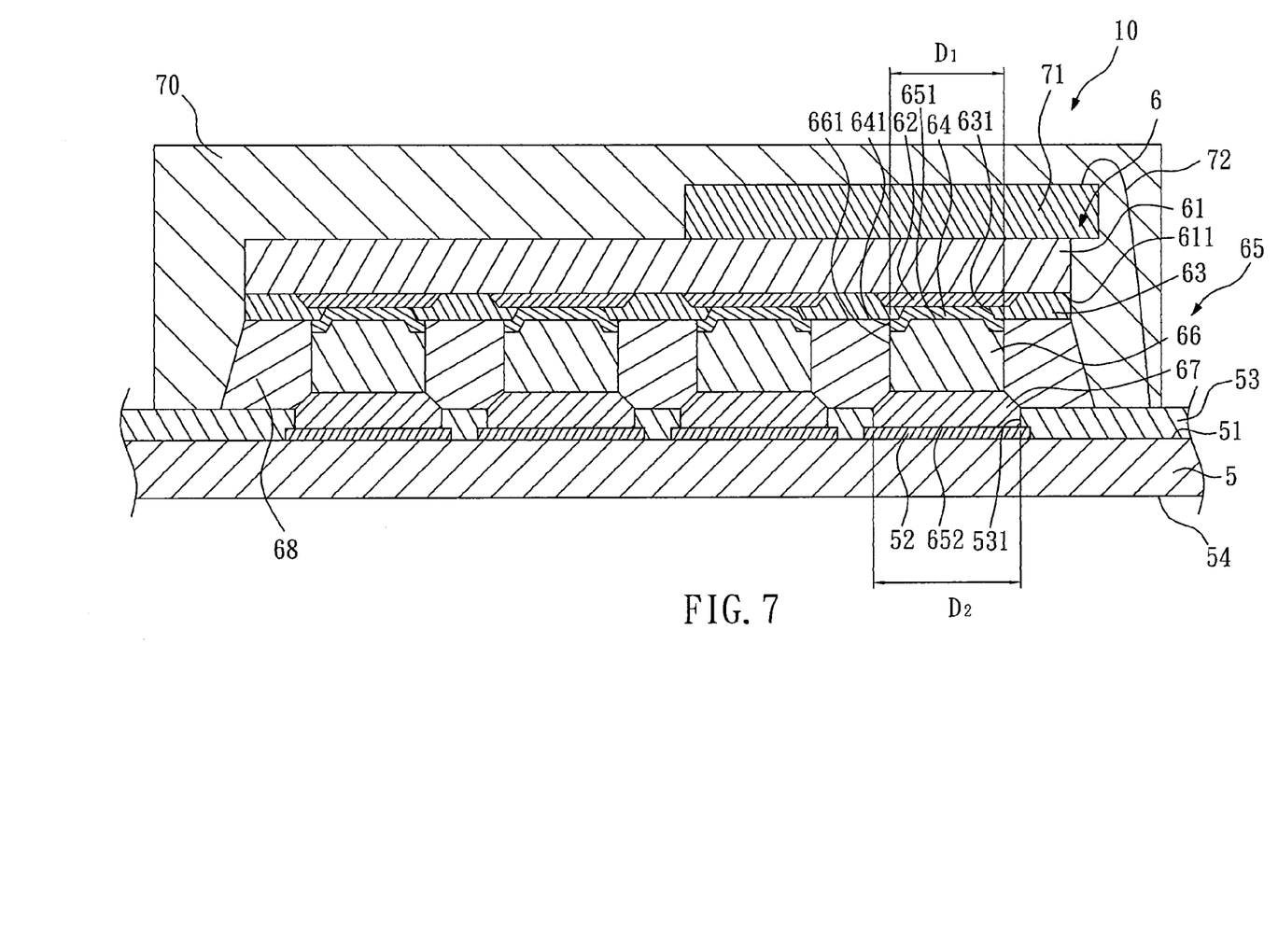
FIG. 7 is a cross-sectional view of a semiconductor device according to a fifth embodiment of the present invention.

FIG. 7 shows a cross-sectional view of a semiconductor device according to a fifth embodiment of the present invention. The semiconductor device 10 according to the fifth embodiment is substantially the same as the semiconductor device 4 (FIG. 2) according to the first embodiment, and the same elements are designated by the same reference numbers. The difference between the semiconductor device 10 and the semiconductor device 4 (FIG. 2) is that the semiconductor device 10 further comprises a wire-bonded chip 71, at least one wire 72 and a molding compound 70. The wire-bonded chip 71 is disposed adjacent to the chip 6. The wire 72 electrically connects the wire-bonded chip 71 to the substrate 5. The molding compound 70 encapsulates the wire-bonded chip 71, the wire 72, part of the substrate 5, the chip 6 and the underfill 68.

While several embodiments of the present invention have been illustrated and described, various modifications and improvements can be made by those skilled in the art. The embodiments of the present invention are therefore described in an illustrative but not restrictive sense. It is intended that the present invention should not be limited to the particular forms as illustrated, and that all modifications which maintain the spirit and scope of the present invention are within the scope defined by the appended claims.

What is claimed is:

1. A semiconductor device, comprising:
   a substrate, including:
      a first surface;
      at least one substrate pad, the substrate pad being disposed adjacent to the first surface; and
      a solder mask disposed adjacent to the first surface and partially covering the substrate pad, the solder mask defining at least one solder mask opening so as to expose a part of the substrate pad;
   a chip, disposed adjacent to the first surface of the substrate and electrically connected to the substrate, the chip including:
      a chip body, including an active surface;
      at least one chip pad, disposed adjacent to the active surface;
      a first passivation, disposed adjacent to the active surface, and defining at least one first passivation opening so as to expose part of the chip pad; and
      an under ball metal layer, disposed adjacent to the chip pad;
   at least one metal pillar structure, wherein the metal pillar structure contacts the under ball metal layer to form a first contact surface having a first diameter, the metal pillar structure contacts the exposed part of the substrate pad to form a second contact surface having a second diameter, the first diameter is less than the second diameter, and the second diameter is substantially equal to a diameter of the solder mask opening; and
   an underfill extending from the first passivation to the solder mask and circumscribing the at least one metal pillar structure.

2. The semiconductor device as claimed in claim 1, wherein the substrate further comprises a second surface and at least one solder ball, and the solder ball is disposed adjacent to the second surface.

3. The semiconductor device as claimed in claim 1, wherein a diameter of the first passivation opening is less than the second diameter of the exposed part of the substrate pad.

4. The semiconductor device as claimed in claim 1, wherein a diameter of the under ball metal layer substantially equals the first diameter.

5. The semiconductor device as claimed in claim 1, wherein the under ball metal layer is a multi-layered structure.

6. The semiconductor device as claimed in claim 1, wherein the metal pillar structure comprises a metal pillar and a solder, the metal pillar contacts the under ball metal layer to form the first contact surface, the solder is disposed adjacent to the metal pillar, and contacts the substrate pad of the substrate to form the second contact surface.

7. The semiconductor device as claimed in claim 6, wherein the external surface of the metal pillar is substantially aligned with the external surface of the under ball metal layer.

8. The semiconductor device as claimed in claim 6, wherein the material of the metal pillar is copper (Cu).

9. The semiconductor device as claimed in claim 6, wherein the metal pillar structure further comprises a barrier layer disposed between the metal pillar and the solder.

10. The semiconductor device as claimed in claim 9, wherein the material of the barrier layer is nickel (Ni).

11. A semiconductor device, comprising:
a substrate, including:
a first surface;
at least one substrate pad, the substrate pad being disposed adjacent to the first surface; and
a solder mask disposed adjacent to the first surface and partially covering the substrate pad, the solder mask defining at least one solder mask opening so as to expose a part of the substrate pad;
a chip, disposed adjacent to the first surface of the substrate and electrically connected to the substrate, the chip including:
a chip body, including an active surface;
at least one chip pad, disposed adjacent to the active surface;
a first passivation, disposed adjacent to the active surface, and defining at least one first passivation opening so as to expose part of the chip pad;
a second passivation disposed adjacent to the first passivation and having at least one second passivation opening so as to expose part of the chip pad; and
an under ball metal layer, disposed adjacent to the chip pad;
at least one metal pillar structure, wherein the metal pillar structure contacts the under ball metal layer to form a first contact surface having a first diameter, the metal pillar structure contacts the exposed part of the substrate pad to form a second contact surface having a second diameter, the first diameter is less than the second diameter, and the second diameter is substantially equal to a diameter of the solder mask opening; and
an underfill extending from the second passivation to the solder mask and circumscribing the at least one metal pillar structure.

12. The semiconductor device as claimed in claim 11, wherein the material of the second passivation is polyimide (PI).

13. The semiconductor device as claimed in claim 11, wherein the second passivation opening is smaller than the first passivation opening.

14. The semiconductor device as claimed in claim 11, wherein the second passivation opening is larger than the first passivation opening, and the second passivation opening further exposes part of the first passivation.

15. The semiconductor device as claimed in claim 11, further comprising a molding compound encapsulating part of the substrate and the chip.

16. The semiconductor device as claimed in claim 11, further comprising a molding compound, wherein the molding compound encapsulates part of the substrate, the chip and the underfill.

17. A semiconductor device, comprising:
a substrate, including:
a first surface;
at least one substrate pad, the substrate pad being disposed adjacent to the first surface; and
a solder mask disposed adjacent to the first surface and defining an exposed portion of the substrate pad smaller than the substrate pad;
a chip, disposed adjacent to the first surface of the substrate and electrically connected to the substrate, the chip including:
a chip body, including an active surface;
at least one chip pad, disposed adjacent to the active surface;
a first passivation, disposed adjacent to the active surface, and defining at least one first opening so as to expose part of the chip pad; and
an under ball metal layer, disposed adjacent to the chip pad; and
at least one metal pillar structure, wherein the metal pillar structure contacts the under ball metal layer to form a first contact surface having a first area, the metal pillar structure contacts the exposed portion of the substrate pad to form a second contact surface having a second area, the first area is smaller than the second area, and the second area is substantially equal to the exposed portion of the substrate pad.

18. The semiconductor device as claimed in claim 17, wherein the metal pillar structure comprises a metal pillar and a solder, the metal pillar contacts the under ball metal layer to form the first contact surface, the solder is disposed adjacent to the metal pillar, and contacts the substrate pad of the substrate to form the second contact surface.

19. The semiconductor device as claimed in claim 17, further comprising a second passivation disposed adjacent to the first passivation and having at least one second passivation opening so as to expose part of the chip pad, wherein the second passivation opening is smaller than the first passivation opening.

20. The semiconductor device as claimed in claim 17, further comprising a second passivation disposed adjacent to the first passivation and having at least one second passivation opening so as to expose part of the chip pad, wherein the second passivation opening is larger than the first passivation opening, and the second passivation opening further exposes part of the first passivation.

* * * * *